(12) United States Patent
Sinha et al.

(10) Patent No.: US 8,390,347 B1
(45) Date of Patent: Mar. 5, 2013

(54) SINGLE PERIOD PHASE TO DIGITAL CONVERTER

(75) Inventors: Anand Kumar Sinha, Noida (IN); Sanjay K. Wadhwa, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/402,844

(22) Filed: Feb. 22, 2012

(51) Int. Cl.
*H03L 7/06* (2006.01)
(52) U.S. Cl. ........................ 327/156; 327/147
(58) Field of Classification Search .......... 327/147, 327/156
See application file for complete search history.

(56) References Cited

U.S. PATENT DOCUMENTS

| | | | |
|---|---|---|---|
| 5,546,433 A | 8/1996 | Tran | |
| 6,326,851 B1 | 12/2001 | Staszewski | |
| 7,786,809 B1 | 8/2010 | Priel | |
| 7,965,117 B2 | 6/2011 | Wadhwa | |
| 8,022,849 B2 | 9/2011 | Zhang | |
| 2009/0174492 A1* | 7/2009 | Zhang | 331/1 R |
| 2009/0256601 A1* | 10/2009 | Zhang et al. | 327/156 |
| 2010/0182049 A1* | 7/2010 | Sjoland | 327/7 |
| 2010/0327912 A1* | 12/2010 | Chiu et al. | 327/5 |
| 2011/0084741 A1* | 4/2011 | Van De Beek | 327/156 |
| 2011/0133799 A1* | 6/2011 | Dunworth et al. | 327/157 |
| 2011/0316595 A1* | 12/2011 | Bolton | 327/156 |
| 2012/0081185 A1* | 4/2012 | Wang et al. | 331/25 |
| 2012/0112841 A1* | 5/2012 | Hayashi | 331/2 |

OTHER PUBLICATIONS

Kratyuk et al., A Design Procedure for All-Digital Phase-Locked Loops Based on a Charge-Pump Phase-Locked-Loop Analogy, IEEE Transactions on Circuits and Systems-II: Express Briefs, vol. 54, No. 3, Mar. 2007, pp. 247-251, IEEE Press, Piscataway, New Jersey, United States of America.

* cited by examiner

*Primary Examiner* — Adam Houston
(74) *Attorney, Agent, or Firm* — Charles Bergere

(57) ABSTRACT

A phase to digital converter for a digital PLL (Phase Locked Loop) provides an output in the same or single reference clock period for which it is digitizing the phase error information. The phase to digital converter operates on a positive edge of the reference clock and a digital filter operates on the negative edge of the reference clock so the phase correction performed by the PLL occurs in the same reference clock cycle in which the phase to digital converter is digitizing the phase error information.

16 Claims, 9 Drawing Sheets

| F0 | F1 | F2 | F3 | F4 | F5 | F6 | F7 | F8 | F9 | F10 | F11 | F12 | F13 | F14 | F15 | FINE DATA 4:0 |
|---|---|---|---|---|---|---|---|---|---|---|---|---|---|---|---|---|
| 1 | 1 | 1 | 1 | 1 | 1 | 1 | 1 | 1 | 1 | 1 | 1 | 1 | 1 | 1 | 1 | 00000 |
| 0 | 1 | 1 | 1 | 1 | 1 | 1 | 1 | 1 | 1 | 1 | 1 | 1 | 1 | 1 | 1 | 00001 |
| 0 | 0 | 1 | 1 | 1 | 1 | 1 | 1 | 1 | 1 | 1 | 1 | 1 | 1 | 1 | 1 | 00010 |
| 0 | 0 | 0 | 1 | 1 | 1 | 1 | 1 | 1 | 1 | 1 | 1 | 1 | 1 | 1 | 1 | 00011 |
| 0 | 0 | 0 | 0 | 1 | 1 | 1 | 1 | 1 | 1 | 1 | 1 | 1 | 1 | 1 | 1 | 00100 |
| 0 | 0 | 0 | 0 | 0 | 1 | 1 | 1 | 1 | 1 | 1 | 1 | 1 | 1 | 1 | 1 | 00101 |
| 0 | 0 | 0 | 0 | 0 | 0 | 1 | 1 | 1 | 1 | 1 | 1 | 1 | 1 | 1 | 1 | 00110 |
| 0 | 0 | 0 | 0 | 0 | 0 | 0 | 1 | 1 | 1 | 1 | 1 | 1 | 1 | 1 | 1 | 00111 |
| 0 | 0 | 0 | 0 | 0 | 0 | 0 | 0 | 1 | 1 | 1 | 1 | 1 | 1 | 1 | 1 | 01000 |
| 0 | 0 | 0 | 0 | 0 | 0 | 0 | 0 | 0 | 1 | 1 | 1 | 1 | 1 | 1 | 1 | 01001 |
| 0 | 0 | 0 | 0 | 0 | 0 | 0 | 0 | 0 | 0 | 1 | 1 | 1 | 1 | 1 | 1 | 01010 |
| 0 | 0 | 0 | 0 | 0 | 0 | 0 | 0 | 0 | 0 | 0 | 1 | 1 | 1 | 1 | 1 | 01011 |
| 0 | 0 | 0 | 0 | 0 | 0 | 0 | 0 | 0 | 0 | 0 | 0 | 1 | 1 | 1 | 1 | 01100 |
| 0 | 0 | 0 | 0 | 0 | 0 | 0 | 0 | 0 | 0 | 0 | 0 | 0 | 1 | 1 | 1 | 01101 |
| 0 | 0 | 0 | 0 | 0 | 0 | 0 | 0 | 0 | 0 | 0 | 0 | 0 | 0 | 1 | 1 | 01110 |
| 0 | 0 | 0 | 0 | 0 | 0 | 0 | 0 | 0 | 0 | 0 | 0 | 0 | 0 | 0 | 1 | 01111 |
| 0 | 0 | 0 | 0 | 0 | 0 | 0 | 0 | 0 | 0 | 0 | 0 | 0 | 0 | 0 | 0 | 10000 |
| 1 | 0 | 0 | 0 | 0 | 0 | 0 | 0 | 0 | 0 | 0 | 0 | 0 | 0 | 0 | 0 | 10001 |
| 1 | 1 | 0 | 0 | 0 | 0 | 0 | 0 | 0 | 0 | 0 | 0 | 0 | 0 | 0 | 0 | 10010 |
| 1 | 1 | 1 | 0 | 0 | 0 | 0 | 0 | 0 | 0 | 0 | 0 | 0 | 0 | 0 | 0 | 10011 |
| 1 | 1 | 1 | 1 | 0 | 0 | 0 | 0 | 0 | 0 | 0 | 0 | 0 | 0 | 0 | 0 | 10100 |
| 1 | 1 | 1 | 1 | 1 | 0 | 0 | 0 | 0 | 0 | 0 | 0 | 0 | 0 | 0 | 0 | 00101 |
| 1 | 1 | 1 | 1 | 1 | 1 | 0 | 0 | 0 | 0 | 0 | 0 | 0 | 0 | 0 | 0 | 10110 |
| 1 | 1 | 1 | 1 | 1 | 1 | 1 | 0 | 0 | 0 | 0 | 0 | 0 | 0 | 0 | 0 | 10111 |
| 1 | 1 | 1 | 1 | 1 | 1 | 1 | 1 | 0 | 0 | 0 | 0 | 0 | 0 | 0 | 0 | 11000 |
| 1 | 1 | 1 | 1 | 1 | 1 | 1 | 1 | 1 | 0 | 0 | 0 | 0 | 0 | 0 | 0 | 11001 |
| 1 | 1 | 1 | 1 | 1 | 1 | 1 | 1 | 1 | 1 | 0 | 0 | 0 | 0 | 0 | 0 | 11010 |
| 1 | 1 | 1 | 1 | 1 | 1 | 1 | 1 | 1 | 1 | 1 | 0 | 0 | 0 | 0 | 0 | 11011 |
| 1 | 1 | 1 | 1 | 1 | 1 | 1 | 1 | 1 | 1 | 1 | 1 | 0 | 0 | 0 | 0 | 11100 |
| 1 | 1 | 1 | 1 | 1 | 1 | 1 | 1 | 1 | 1 | 1 | 1 | 1 | 0 | 0 | 0 | 11101 |
| 1 | 1 | 1 | 1 | 1 | 1 | 1 | 1 | 1 | 1 | 1 | 1 | 1 | 1 | 0 | 0 | 11110 |
| 1 | 1 | 1 | 1 | 1 | 1 | 1 | 1 | 1 | 1 | 1 | 1 | 1 | 1 | 1 | 0 | 11111 |
| 1 | 1 | 1 | 1 | 1 | 1 | 1 | 1 | 1 | 1 | 1 | 1 | 1 | 1 | 1 | 1 | 00000 |

FIG. 5

SINGLE PERIOD PHASE TO DIGITAL CONVERTER

BACKGROUND OF THE INVENTION

The present invention relates generally to electronic circuits including a phase to digital converter, and more particularly to a digital phase-locked loop (PLL) with a phase to digital converter.

A PLL is a control system useful in electronic devices such as radios, computers, telecommunication equipment and the like. The PLL contains a phase frequency detector (PFD) and a controlled oscillator, and traditionally is constructed using a combination of both digital and analog circuitry. The PFD compares the frequencies of an input reference clock and a feedback clock and generates a phase difference of the two input frequencies as an output. If the two input frequencies differ, the PFD generates a periodic output proportional to the difference of frequency/phase. If the reference clock frequency differs from the feedback clock frequency, a phase-error signal is generated and filtered and used to cause the feedback clock to shift and lock-in to maintain the input reference clock frequency.

Since the advent of deep sub-micron technologies (e.g., elements 100 nm and smaller), digital circuits have been replacing the analog components of a PLL. Digital PLLs are becoming more attractive because they can be made with compact digital filters that replace bulky and leaky capacitor and resistor based analog loop filters, and the leakage and current mismatch prone charge pump of an analog PLL is not required in a digital PLL. Additionally, noise susceptible analog control of the controlled oscillator in an analog PLL can be replaced with inherent noise immune digital control for the controlled oscillator in a digital PLL. Thus, in a digital PLL, the phase error information is processed in the digital domain. The phase difference between the reference clock and the feedback clock is digitized and processed by a digital filter, which controls the oscillator frequency.

However, existing PLLs that are completely digital provide phase to digital converter outputs at each rising edge of the reference clock based on the phase difference information obtained from the previous reference clock cycle and therefore, phase correction is delayed by one reference clock cycle. That is, conventional fully digital PLLs correct phase error for the previous phase difference between the reference clock cycle and the feedback clock cycle.

Therefore, a faster output phase to digital converter is needed for faster correction of phase error information by a digital PLL.

BRIEF DESCRIPTION OF THE DRAWINGS

The accompanying drawings incorporated herein and forming a part of the specification illustrate several aspects of the present invention and, together with the description, serve to explain the principles of the invention. While the invention will be described in connection with certain embodiments, there is no intent to limit the invention to the embodiments described. On the contrary, the intent is to cover all alternatives, modifications and equivalents as included within the scope of the invention as defined by the appended claims. In the drawings:

FIG. 5 is a table showing the state of outputs at each unit delay element of the TDC of FIG. 4 in accordance with an embodiment of the invention;

DETAILED DESCRIPTION

Figure 1:
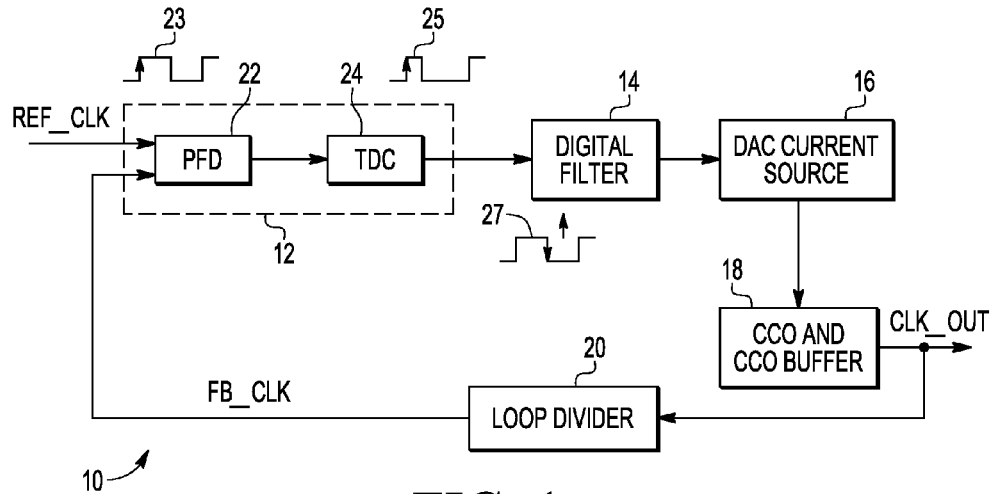
FIG. 1 is a schematic block diagram of a digital phase lock loop (PLL) that corrects the phase for current phase error of a PLL in accordance with an embodiment of the invention.

A phase to digital converter (PDC), method and phase locked loop (PLL) are disclosed. The PDC provides an output in a single reference clock cycle for which the PDC is digitizing phase difference information. A digital filter of the PLL operates on the negative edge of the reference clock so the PLL corrects the phase difference in the same reference clock cycle for which the PDC is digitizing the phase difference information. Since there is no added delay in the signal path (the PLL is correcting phase for the current phase difference between the reference cycle and feedback cycle), and the delay is reduced to a single reference clock period, the loop dynamics and stability of the PLL are readily modelled.

In one embodiment, the present invention provides a phase locked loop for generating an oscillator signal. A phase to digital converter receives a reference clock and a feedback clock, and generates a digital output signal of a phase error difference between the reference clock and the feedback clock. The phase to digital converter operates on a first or rising edge of the reference clock. A digital filter, connected to the phase to digital converter, receives the output signal and generates an oscillator control signal. The digital filter operates on a second or falling edge of the reference clock that is different from the first edge. A controlled oscillator, connected to the digital filter, generates the oscillator signal. The frequency of the oscillator signal is controlled using the oscillator control signal. A loop divider, connected to the controlled oscillator, receives and divides the oscillator signal to generate the feedback signal. The phase to digital converter provides the digital output signal in a single clock period of the reference clock.

In another embodiment the present invention provides phase to digital converter (PDC) for receiving a reference clock and a feedback clock, and generating a digital output signal of a phase difference between the reference clock and the feedback clock, wherein the digital output signal includes a sign bit and a magnitude portion. The PDC comprises a first reset pulse circuit that receives the reference clock and the feedback clock and generates the sign bit, and a second reset pulse circuit that receives the reference clock and the feedback clock and generates phase difference information and a synchronization pulse signal. A thermometric to binary converter is connected to the second reset pulse circuit and generates low order bits of the magnitude portion of the digital output signal. A coarse counter is connected to the second reset pulse circuit and generates high order bits of the magnitude portion of the digital output signal.

In yet another embodiment the present invention provides a phase to digital conversion method, including the steps of receiving a reference clock and a feedback clock; determining a phase difference between the reference clock and the feedback clock; determining a time difference between the reference clock and the feedback clock; generating a digital signal corresponding to the time difference; generating a synchronization clock using a reset pulse signal generated by a phase frequency detector; and using the synchronization clock to deliver a digital value of the phase error difference between the reference clock and the feedback clock.

Referring now to FIG. 1, a schematic block diagram of a digital phase lock loop (PLL) 10 in accordance with an embodiment of the present invention is shown. The PLL 10 generates an oscillator signal or clock out (CLK_OUT) based on a reference clock (REF_CLK) and a feedback clock (FB_CLK). In the embodiment shown, REF_CLK is an externally provided clock signal and FB_CLK is generated internally by the PLL 10. More particularly, REF_CLK and FB_CLK are received by a phase to digital converter (PDC) 12. The PDC 12 compares REF_CLK with FB_CLK and generates a digital output signal indicative of a phase difference between REF_CLK and FB_CLK. According to the present invention, the PDC 12 operates on a first edge of REF_CLK, which in one embodiment is the rising edge.

A digital filter 14 is connected to the PDC 12 and receives the PDC 12 digital output signal and generates a filtered signal. According to the present invention, the digital filter 14 operates on a second edge of REF_CLK that is different from the first edge. The filtered signal is provided to a digital to analog converter (DAC) current source 16, which translates the filtered signal to an oscillator control signal. The oscillator control signal is provided to a current controlled oscillator 18 (CCO and CCO buffer), which generates the oscillator signal (CLK_OUT). The oscillator control signal is used to control a frequency of the generated oscillator signal, as is known in the art. The oscillator signal is provided to a loop divider 20, which divides the oscillator signal to generate FB_CLK. Although the aforedescribed components are generally known in the art, as discussed in detail below, the PDC 12 has been designed such that the PDC 12 provides the digital output signal in a single clock period of the reference clock so the phase correction performed by the PLL 10 occurs in the same reference clock cycle in which the PDC 12 is digitizing the phase error information.

The PDC 12 includes a phase frequency detector (PFD) 22 that receives REF_CLK and begins processing REF_CLK at its positive or rising edge 23, and a time to digital converter (TDC) 24 that receives control signals generated by the PFD 22, including a PFD reset signal 25 at its positive or rising edge. The TDC 24 generates a magnitude and sign of the phase difference and outputs the digital output signal of the PDC 12 to the digital filter 14. According to one embodiment of the present invention, the digital filter 14 operates on the falling or negative edge of REF_CLK, as shown at 27.

The PDC 12 provides an output in the same cycle as that in which REF_CLK and FB_CLK are received, and the PLL 10 corrects the phase for the current phase difference between REF_CLK and FB_CLK. A single clock period has two edges, a positive or rising edge at the start of the clock period and a negative or falling edge that marks the end of a half clock period. As noted above, the reference clock is at the PFD 22 at the rising edge 23, and at the digital filter 14 at the falling edge 27.

It will be appreciated that the components of the PLL 10 may be all digital or mixed digital and analog elements. For example, the PFD 22, TDC 24, digital filter 14, and loop divider 20 may be digital, while the DAC current source 16 and CCO and CCO buffer 18 may be analog.

Figure 2:
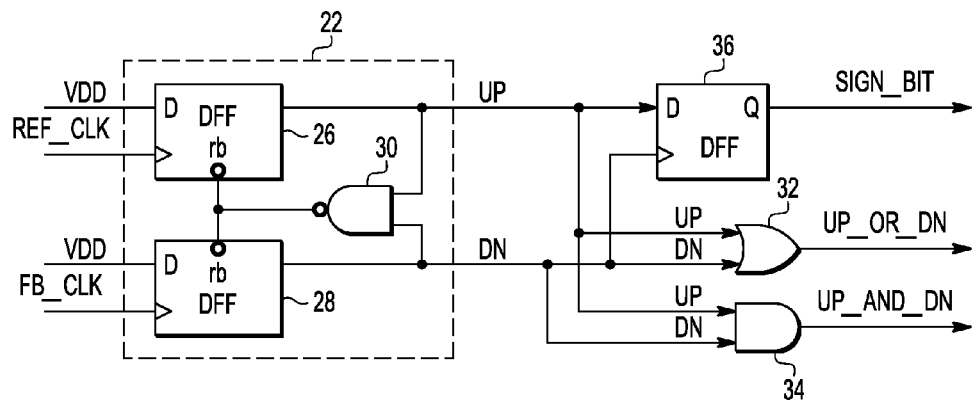
FIG. 2 is a schematic block diagram of a phase to digital converter (PDC) of the PLL of FIG. 1.

FIG. 2 is a block diagram of one embodiment of a portion of the PDC 12 of FIG. 1 shown in more detail. The reference clock (REF_CLK) and the feedback clock (FB_CLK) are input to the PFD 22. The PFD 22 has a first D flip-flop 26 that receives REF_CLK at its clock input and VDD at its data input, and a second D flip-flop 28 that receives FB_CLK at its clock input and VDD at its data input. The output of the first D flip-flop 26 is an UP signal and the output of the second D flip-flop 28 is a DN signal. The UP and DN signals are input to a NAND gate 30 and the output of the NAND gate 30 is input to the reset inputs of the first and second D flip-flops 26, 28.

Figure 6:
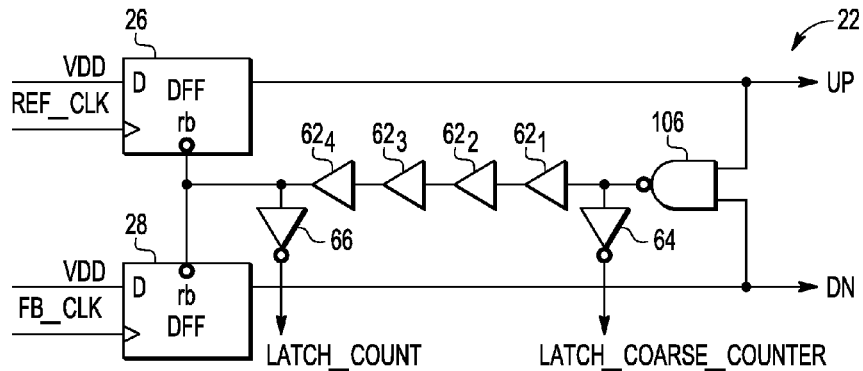
FIG. 6 is a schematic block diagram of another portion of the TDC of the PDC of FIG. 1 in accordance with another embodiment of the invention.
Figure 11:
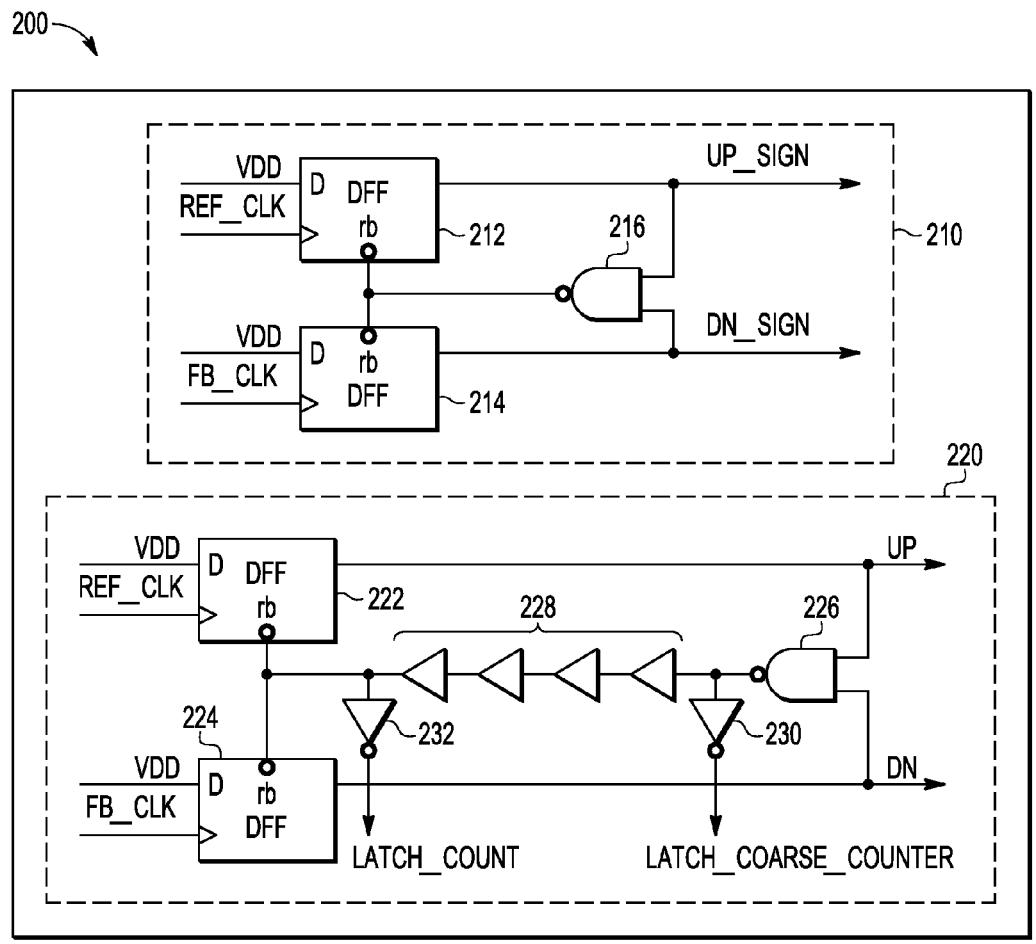
FIG. 11 is a schematic block diagram of a dual PFD structure PFD in accordance with an embodiment of the invention.

An OR gate 32 receives the UP and DN signals and generates an UP_OR_DN signal, and an AND gate 34 also receives the UP and DN signals and generates an UP_AND_DN signal. A third D flip-flop 36 receives the UP signal at its data or D input and the DN signal at its clock input, and generates a SIGN_BIT signal at its output. It should be noted that further details of the PDC 12 are shown in FIGS. 4, 6 and 11 and as such, FIG. 2 is provided to illustrate the generation of the sign bit and the phase/time difference information.

Figure 3:
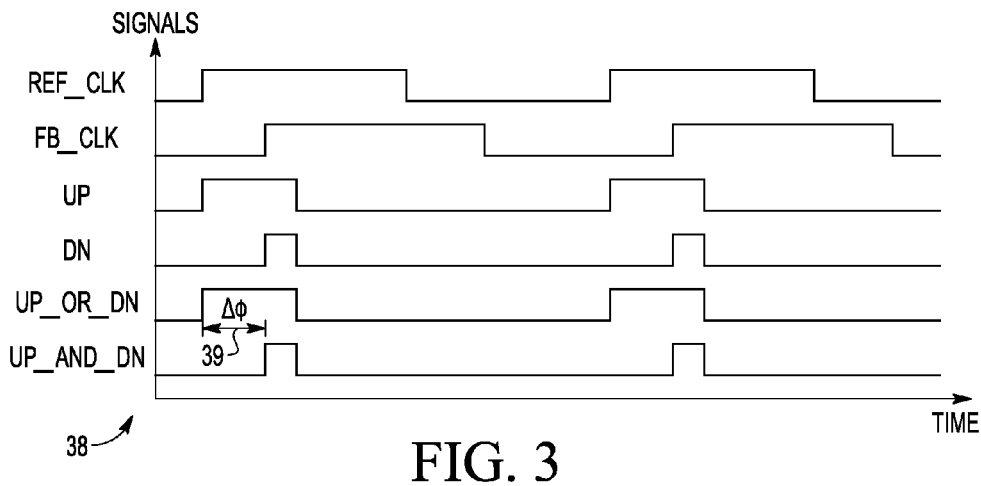
FIG. 3 is a timing diagram of signals of the PDC of FIG. 2 in accordance with an embodiment of the invention.

FIG. 3 is a timing diagram 38 of the signals shown in FIG. 2. In the drawing, it can be seen that the UP signal output from the first D flip-flop 26 goes high when REF_CLK goes high and the DN signal output from the second D flip-flop 28 goes high when FB_CLK goes high. Then, both UP and DN go low when the first and second D flip-flops 26, 28 are reset by the output of the NAND gate 30. The phase difference $\Delta\phi$ 39 between REF_CLK and FB_CLK is the time duration during which UP_OR_DN is high and UP_AND_DN is low. It is preferred that the phase difference $\Delta\phi$ 39 (beginning at the rising edge of UP_OR_DN and ending at the rising edge of UP_AND_DN) is sampled with a high frequency clock, for example, with just a single buffer delay of the order of 30 ps to 60 ps.

Figure 4:
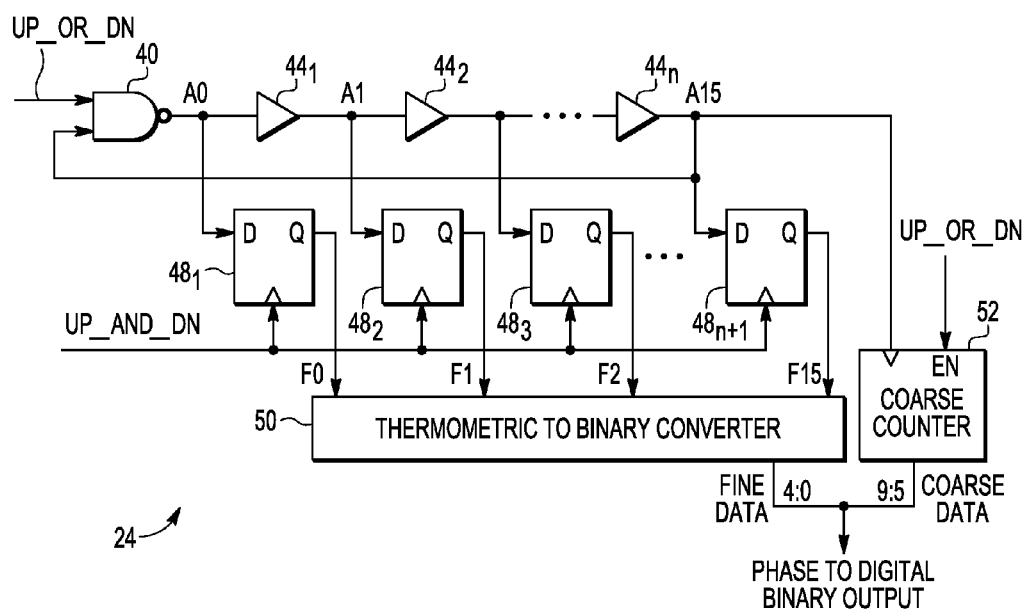
FIG. 4 is a schematic block diagram of a portion of a time to digital converter (TDC) of the PDC of FIG. 1 in accordance with an embodiment of the invention.

FIG. 4 is a simplified block diagram of the time to digital converter (TDC) 24 of the phase to digital converter (PDC) 12 of FIG. 1 in accordance with an embodiment of the invention. The TDC 24 uses the UP_OR_DN and UP_AND_DN signals generated by the PFD 22 (see FIG. 2) to determine the magnitude of the phase difference. The TDC 24 comprises a NAND gate 40, a cascade of unit delay elements, here implemented as buffers $44_1$ to $44_n$, a cascade of flip-flops (DFFs) $48_1$ to $48_{n+1}$, a thermometric to binary converter 50, and a coarse counter 52.

The UP_OR_DN signal and the output of the buffer $44_n$, which is shown as $A_{15}$, are input of the NAND gate 40. The output of the NAND gate 40 is signal $A_0$, which is input to the buffer $44_1$ and the D input of DFF $48_1$. The NAND gate 40 and cascade of buffers $44_1$ to $44_n$ provide output signals $A_0$ to $A_n$, respectively. In the embodiment shown in FIG. 4, n=15. It will be appreciated that n may be greater or less than 15 as long as the resulting number of buffers provides a sufficient delay range for the desired functionality. Each output signal $A_0$ to $A_{15}$ is provided to a D input to one of the respective DFFs $48_1$ to $48_{n+1}$. The UP_AND_DN signal is provided to the clock inputs of each of the DFFs $48_1$ to $48_{n+1}$, and the Q outputs of the DFFs $48_1$ to $48_{n+1}$ are input to the thermometric to binary converter 50 as F0 to F15. The thermometric to binary converter 50 then receives F0 to F15 and generates fine data, which in this embodiment are the phase to digital binary output bits 4:0.

The output of the last unit delay element $44_n$ (A15) is input to the coarse counter 52 and the UP_OR_DN signal is input to the coarse counter 52 as an enable signal. The coarse counter 52 generates coarse data (higher order bits 9:5). More particularly, the thermometric to binary converter 50 takes 16 thermometric bits and translates these bits into 5 LSB of binary output data. When one cycle of fine loop completes, (i.e., A15 moves from 0 to 1), the coarse counter 52 is incremented by 1. Also, when A15 moves from 0 to 1, then all thermometric bits will be at logic '1', which corresponds to a 0 binary value provided by the fine loop. The loop continues in this manner and for higher phase/time difference, the coarse counter value is incremented whenever one fine loop cycle is completed. Thus, it should be noted that at latch count, data is collected/latched from the thermometric to binary converter and the coarse counter, but the thermometric to binary converter and the coarse counter are reset by the UP_OR_DN signal.

A fine loop cycle means measurement of lower/fine phase/time difference and the coarse loop cycle means measurement of higher/coarse phase difference. Thus, together, the thermometric to binary converter 50 and the coarse counter 52 generate the PDC 12 digital output signal that is provided to the digital filter 14. In one embodiment of the present invention, the coarse counter 52 operates on the rising edge of $A_{15}$.

FIG. 5 is a table showing an example state of outputs F0 to F15 (outputs of DFFs $48_1$ to $48_{n+1}$ of FIG. 4) and the corresponding fine data bits (4:0) generated by the thermometric to binary converter 50. It is to be noted that when F15 moves from 0 to 1, the coarse counter 52 is incremented by 1 and the fine loop equivalent binary value moves to 0.

FIG. 6 is a block diagram of a portion of the PFD 22 in accordance with an embodiment of the present invention that illustrates the generation of synchronization clocks for delivering the output of the PDC 12 to the digital filter 14. As previously discussed, REF_CLK and FB_CLK are provided to the clock inputs of the first and second DFFs 26 and 28, respectively, and the data inputs are tied to VDD. The output of the first DFF 26 is the UP signal and the output of the second DFF 28 is the DN signal. The UP and DN signals are input to a NAND gate 106. The output of the NAND gate 106 is input to a first unit delay element (buffer) $62_1$ of a plurality of series connected unit delay elements $62_1$ to $62_4$. The output of the last unit delay element $62_4$ is input to the reset inputs of the first and second DFFs 26, 28. It will be appreciated that the number of delay elements or buffers may be more or less than the four buffers shown as long as sufficient buffering and hence time delay is achieved for the desired functionality.

FIG. 6 shows that the output of the NAND gate 106 is input to a first NOT gate 64, and the output of the fourth unit delay element $62_4$ is input to a second NOT gate 66. The output of the first NOT gate 64 is a LATCH_COARSE_COUNTER signal, and the output of the second NOT gate 66 is a LATCH_COUNT signal. The LATCH_COARSE_COUNTER signal and LATCH_COUNT signals are delayed UP_AND_DN signals that are synchronized with both REF_CLK and FB_CLK. These two signals will be described in more detail below with reference to FIGS. 7 and 8.

Figure 7:
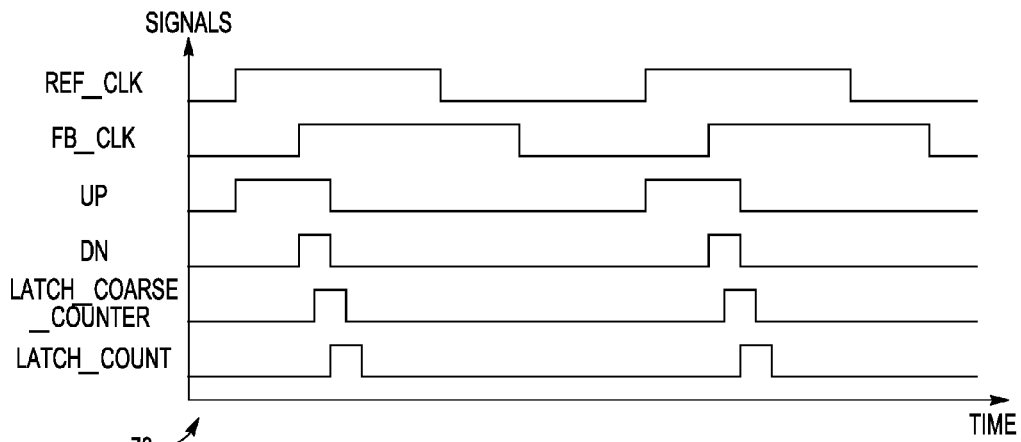
FIG. 7 is a timing diagram of the signals shown in the circuit of FIG. 6.

FIG. 7 is a timing diagram 70 showing the generation of the LATCH_COARSE_COUNTER (PFD reset pulse) and LATCH_COUNT signals of FIG. 6. As can be seen, the LATCH_COARSE_COUNTER signal goes high when UP and DN are both high except there is a delay caused by NOT gate 64. The LATCH_COUNT signal follows the LATCH_COARSE_COUNTER signal except that it is delayed by the buffers $62_1$ to $62_4$ and the NOT gate 66. Thus, the LATCH_COARSE_COUNTER and LATCH_COUNT signals are synchronized with both REF_CLK and FB_CLK, and are generated to synchronize and deliver the output of the PDC 12.

Figure 8:
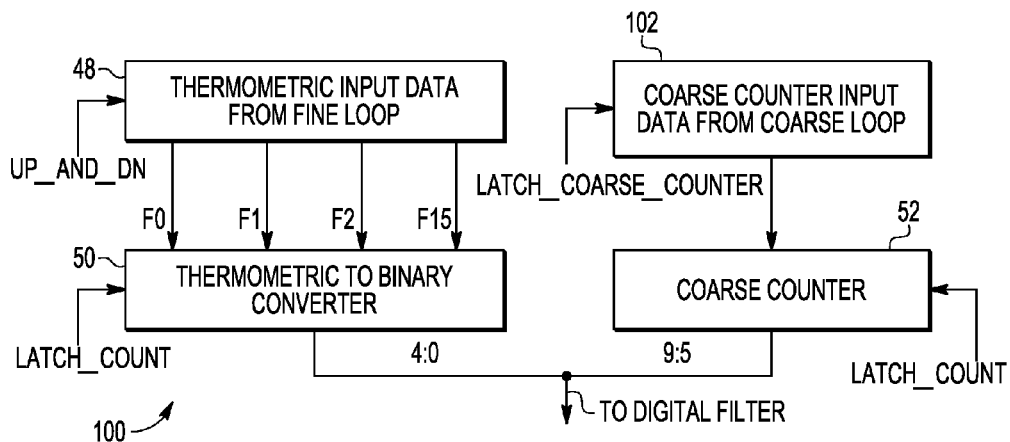
FIG. 8 is a data flow diagram for the TDC of FIG. 6 in accordance with an embodiment of the invention.

FIG. 8 is a schematic diagram 100 illustrating the flow of data through the PDC 12 of FIG. 1, in accordance with an embodiment of the invention. The diagram shows that the thermometric to binary converter 50 receives input data $F_0$ to $F_{15}$ from the fine loop ($F_0$ to $F_{15}$ from DFFs 48 of FIG. 4), while the coarse counter 52 receives coarse counter input data 102 (i.e., A15 from buffer $44_n$) from the coarse loop. The thermometric to binary converter 50 outputs fine data bits 4:0 and the coarse counter 52 outputs coarse data bits 9:5. The thermometric input data from the fine loop 48 is delivered at the rising edge of the UP_AND_DN signal (UP_AND_DN is the input to the clocks of the DFFs 48, FIG. 4), and provided to the input of the thermometric to binary converter 50. The coarse counter input data 102 from the coarse loop is latched at the rising edge of the LATCH_COARSE_COUNTER signal (see FIG. 7). The output of the thermometric to binary converter 50 and the output of the coarse counter 52 are delivered at the rising edge of the LATCH_COUNT signal (see FIG. 7). Note that the delay between the UP_AND_DN and LATCH_COUNT signals should be more than the thermometric to binary converter 50 delay, and this delay is provided by buffers $62_1$ to $64_4$. Therefore, at the rising edge of LATCH_COUNT, the binary data generated by the PDC 12 is provided to the input of the digital filter 14.

Figure 9:
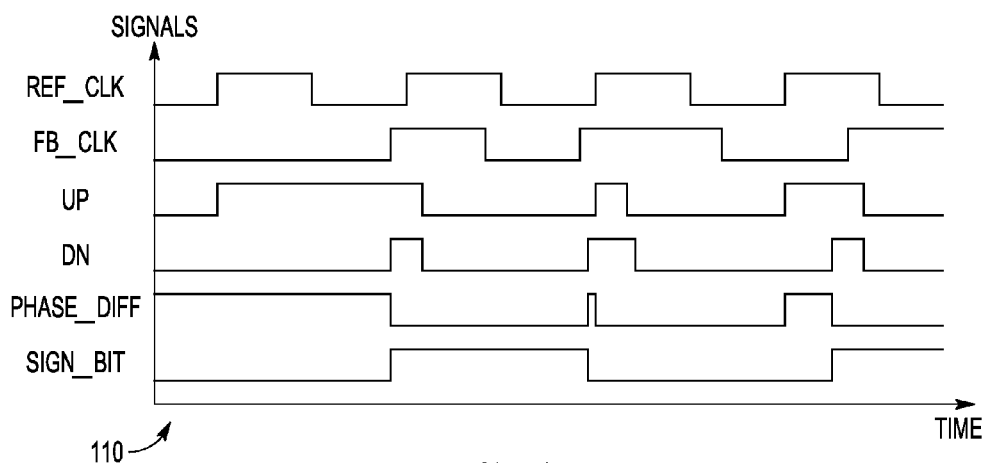
FIG. 9 is a timing diagram of some of the signals of the circuit shown in FIG. 6 for illustrating a scenario with a PFD reset signal with a long pulse.
Figure 10:
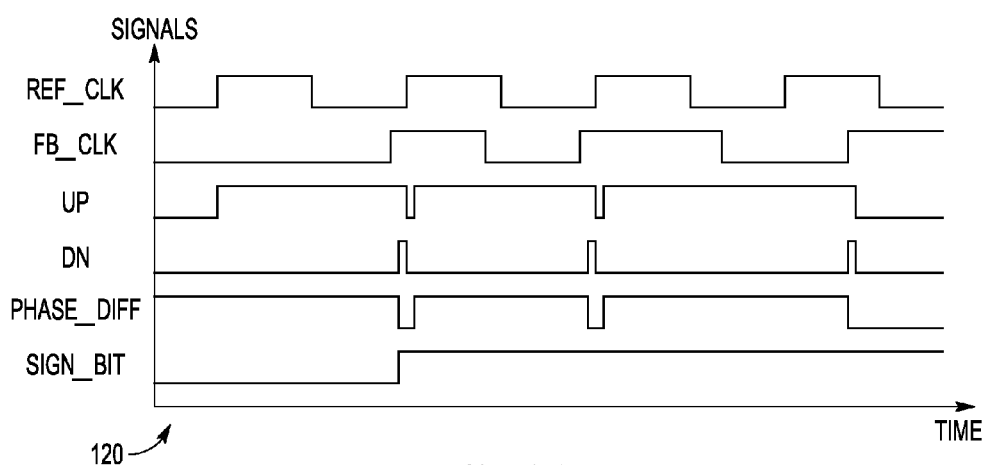
FIG. 10 is another timing diagram of some of the signals of the circuit shown in FIG. 6 for illustrating a scenario with a PFD reset pulse with a short pulse.

FIGS. 9 and 10 are timing diagrams 110 and 120 that illustrate some of the signals of the PDC 12 such as REF_CLK, FB_CLK, UP, DN, PHASE_DIFF, and SIGN_BIT. As discussed with reference to FIG. 2, the UP and DN signals are generated by the DFFs 26 and 28, and the SIGN_BIT signal is generated by the DFF 36, which receives the UP signal at its data input, and the DN signal at its clock input. FIGS. 9 and 10 also show a PHASE_DIFF signal, which is a symbolic representation of the phase difference between the reference clock and the feedback clock.

The timing diagram 110 (FIG. 9) illustrates the case where the PFD reset signal (i.e., the reset signal input to DFFs 26 and 28, which is the output of the NAND gate 106 delayed by the buffers $62_1$ to $62_4$ of FIG. 6) has a longer delay than for the case where the PFD reset signal is not delayed (see FIG. 2 where the PFD reset signal goes directly from the NAND gate 30 to the DFFs 26, 28. The longer delay reset pulse is required to generate synchronization signals (LATCH_COARSE_COUNTER and LATCH_COUNT) to properly generate the binary output signal of the PDC 12. However, if the pulse of the PFD reset signal is too long, then some edge transitions in REF_CLK and FB_CLK may be missed, which would result in generation of an erroneous SIGN_BIT signal. It will be appreciated that the occurrence of an erroneous SIGN_BIT should be avoided. FIG. 9 illustrates that the second rising edge of the REF_CLK has been missed due to a long reset pulse width.

The timing diagram 120 (FIG. 10) illustrates the case where the PFD reset signal (i.e., the reset signal input to DFFs 26 and 28, which is the output of NAND gate 30 without any buffer delay, as shown in FIG. 2) has a short pulse width. This could occur when there is minimum delay in the path from NAND gate 30 to the reset pins of DFFs 26 and 28, like NAND gate 30 directly driving the reset pins of DFF 26 and 28 (FIG. 2). The timing diagram 120 shows that if the PFD reset signal pulse width is small, then there is very low probability of missing REF_CLK positive edge or FB_CLK positive edge, so there is very low probability of erroneous sign bit generation. Thus, based on the illustrations of SIGN_BIT generation shown in FIGS. 9 and 10, the preferred embodiment of the present invention uses a dual PFD architecture, as shown in FIG. 11 and discussed below.

FIG. 11 is a schematic block diagram illustrating a dual PFD circuit 200 in accordance with a preferred embodiment of the present invention. The dual PFD circuit 200 includes a shorter PFD reset pulse circuit 210 for generating a correct sign bit corresponding to the phase difference, as discussed with reference to FIG. 10, and a longer PFD reset pulse circuit 220 for generating the phase/time difference and it's corresponding digital value and synchronization clock to deliver the output of the PDC 12.

The shorter PFD reset pulse circuit 210 includes first and second DFFs 212, 214, which are like the DFFs 26 and 28 shown in FIG. 2, but generate signals called UP_SIGN and DN_SIGN, respectively. The shorter PFD reset pulse circuit 210 also has a NAND gate 216 that receives the UP_SIGN and DN_SIGN signals and generates a DFF reset signal provided to the reset inputs of the first and second DFFs 212, 214. The UP_SIGN and DN_SIGN signals are used to generate SIGN_BIT and as such, are respectively provided at the data and clock inputs of DFF 36 (FIG. 2).

The longer PFD reset pulse circuit 220 includes third and fourth DFFs 222, 224, which are like the DFFs 26 and 28 shown in FIG. 6, used to generate the UP and DN signals, respectively. The longer PFD reset pulse circuit 220 also has a NAND gate 226 that receives the UP and DN signals. The output of NAND gate 226 is input to a first NOT gate 230, and the first NOT gate 230 outputs the LATCH_COARSE_COUNTER signal (synchronization signal). The output of NAND gate 226 also is input to a string of series connected buffers 228 (4 in this embodiment) and the output of the last buffer of the connected buffers 228 is input to the reset input of the third and fourth DFFs 222, 224 and also to a second NOT gate 232. The output of the second NOT gate 232 is the LATCH_COUNT signal.

The UP and DN signals generated by the third and fourth DFFs 222, 224 are used to generate the digital value of the phase difference between REF_CLK and FB_CLK, as previously discussed. Thus, the UP and DN signals are provided to the OR gate 32 and AND gate 34 of FIG. 2 to generate the UP_OR_DN and UP_AND_DN signals. The UP_OR_DN and UP_AND_DN signals are used as previously discussed with reference to FIG. 4 to generate the digital value of the phase difference between REF_CLK and FB_CLK.

In the short reset pulse scenario, the output of the first DFF 212 is the UP_SIGN signal and the output of the second DFF 214 is the DN_SIGN signal. In the long reset pulse scenario, the output of the first inverter 230 is LATCH_COARSE_COUNTER and the output of the second inverter 232 is LATCH_COUNT. At the rising edge of the UP_AND_DN signal (output of AND gate 34 of FIG. 2), thermometric data from the fine loop is acquired and at the rising edge of LATCH_COUNT (output of NOT gate 232 of FIG. 11), complete phase to digital data is delivered to the digital filter 14. Therefore, the delay between UP_AND_DN and LATCH_COUNT should be more than the delay of the thermometric to binary conversion delay of the fine loop.

In use, the dual PFD circuit 200 ensures that even for both short and long reset pulses widths, the correct SIGN_BIT signal and phase to digital binary output are generated in the same cycle for which the PLL 10 is digitizing the phase difference. While the PDC 12 operates on the rising edge of the reference clock, the digital filter 14 operates on the falling edge of the reference clock. The PLL 10 corrects the phase for the current cycle phase difference within the same or single period of the reference clock.

Figure 12:
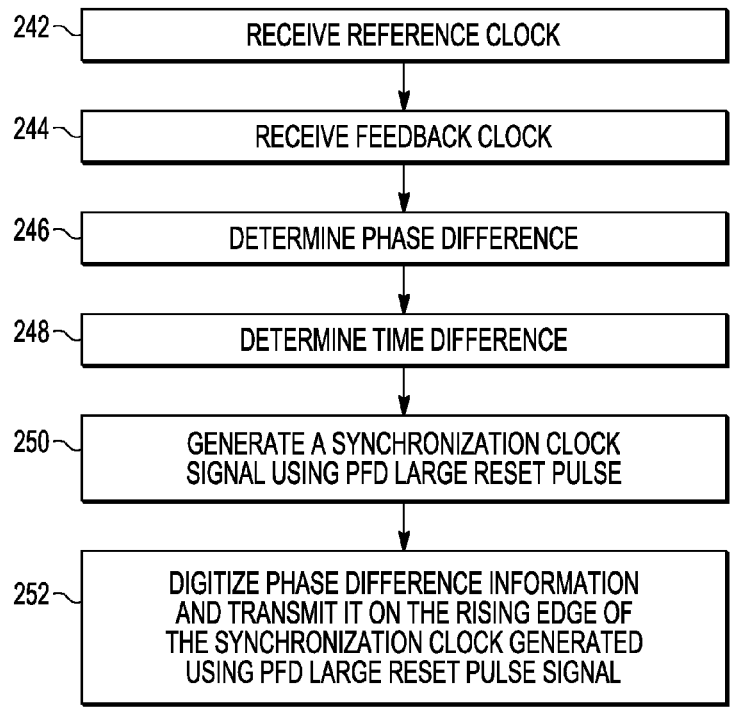
FIG. 12 is a flow chart of a method of operating a phase to digital converter in accordance with an embodiment of the invention.

FIG. 12 is a flow chart of a method 240 of a phase to digital converter in accordance with an embodiment of the invention. In a first step 242, a reference clock is received. At step 244, a feedback clock signal is received. At step 246, a phase difference between the reference clock and the feedback clock is determined, and at step 248 a time difference between these clock signals is determined. At step 250, a synchronization clock signal is generated using a PFD large reset pulse signal. At step 252, the phase difference information is digitized and transmitted on the rising edge of the synchronization clock generated using the PFD large reset pulse.

Figure 13:
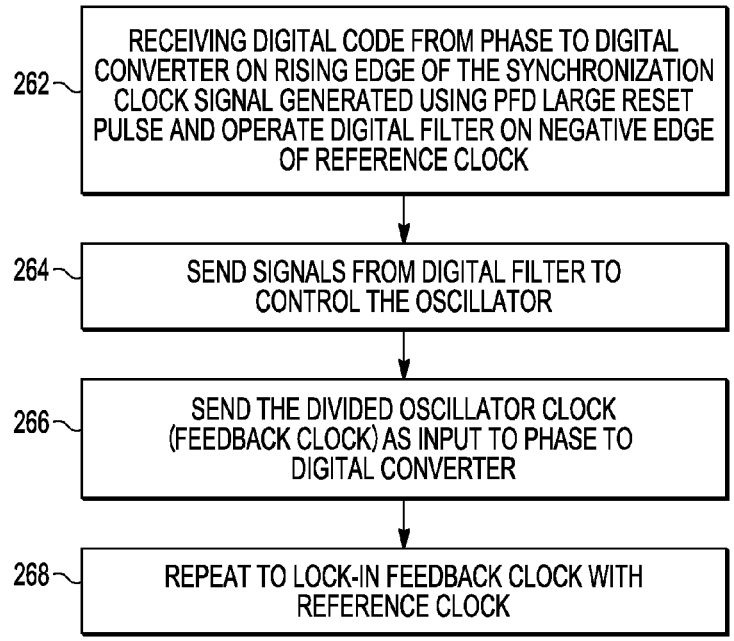
FIG. 13 is a flow chart of a method of operating a PLL having a phase to digital converter in accordance with an embodiment of the invention.

FIG. 13 is a flow chart of a method 260 for a PLL having a phase to digital converter in accordance with an embodiment of the invention. The steps comprise receiving digital code from a phase to digital converter on the rising edge of a synchronization clock signal using a phase frequency detector (PFD) large reset pulse signal and operating a digital filter on the negative edge of the reference clock at step 262 and sending signals from the digital filter to control an oscillator at step 264. At step 266 a divided oscillator clock (feedback clock) is input to the phase to digital converter, and step 268 shows repeating to lock-in the feedback clock with the reference clock.

Figure 14:
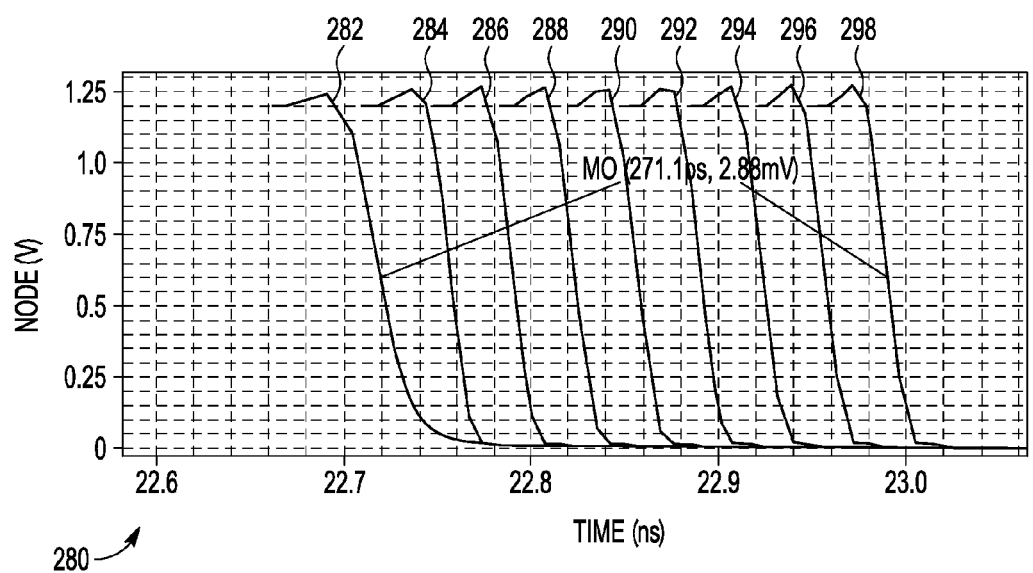
FIG. 14 is a graph of the output of each unit delay unit ($A_0$ to $A_8$) of the TDC of FIG. 6 in accordance of an embodiment of the invention.

FIG. 14 is a graph 280 of the output signals of the unit delay elements ($A_0$ to $A_8$) of the TDC 24 (see FIG. 4), in accordance of an embodiment of the invention. The curve 282 is output $A_0$, curve 284 is output $A_1$, curve 286 is output $A_2$, curve 288 is output $A_2$, curve 290 is output $A_4$, curve 292 is output $A_5$, curve 294 is output $A_6$, curve 296 is output $A_7$, and curve 298 is output $A_8$. As shown in the graph 280, the total delay is 271.1 ps and the average unit delay is approximately (271.1 ps/8) or 33.8875 ps.

Figure 15:
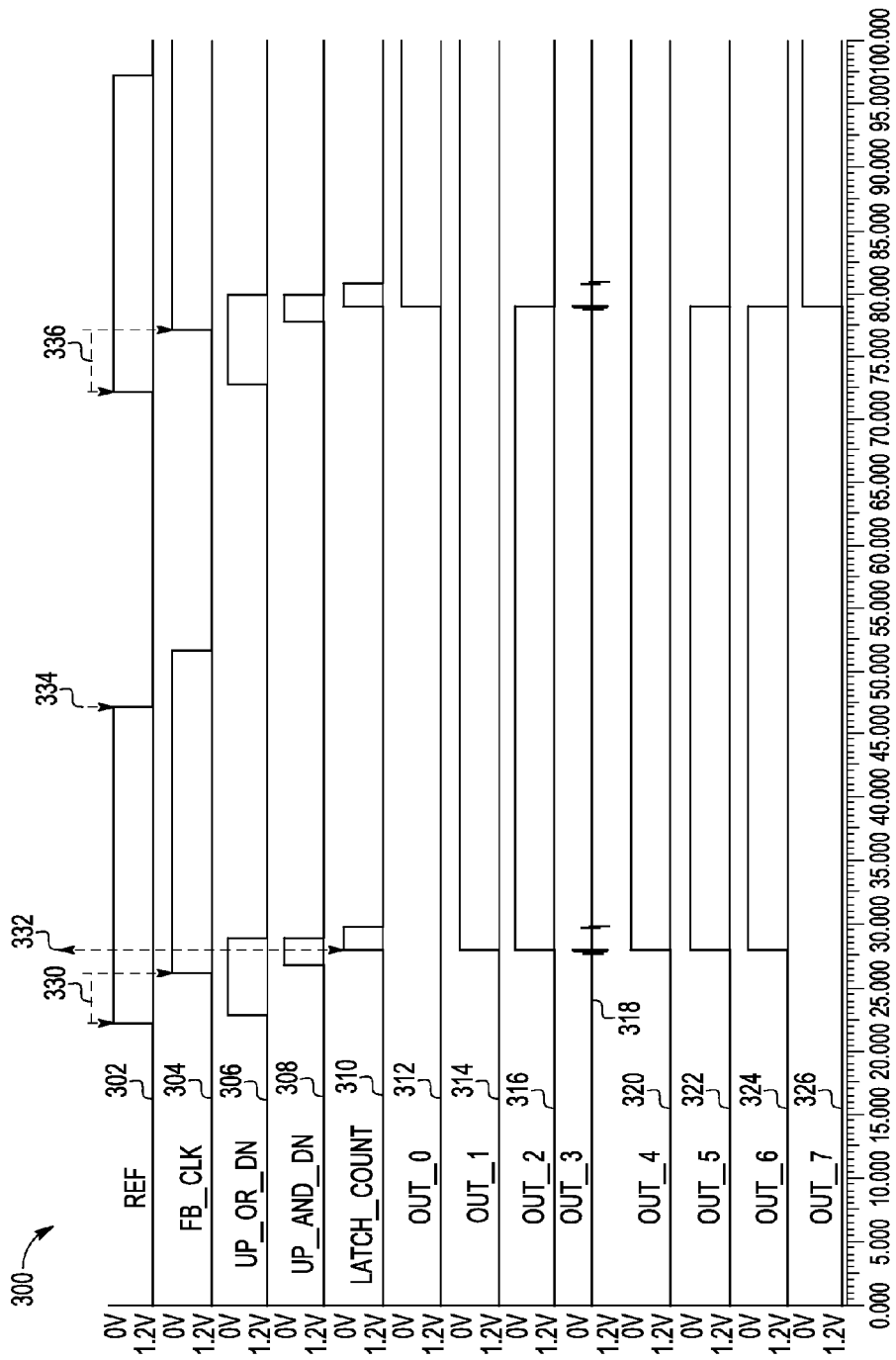
FIG. 15 is a timing diagram of an output of the PDC of the PLL of FIG. 1 in accordance of an embodiment of the invention.

FIG. 15 is a timing diagram 300 showing response curves of the output of the PDC 12 of the PLL 10 of FIG. 1, in accordance of an embodiment of the invention. The response curves shown are REF 302, FB_CLK 304, UP_OR_DN 306, UP_AND_DN 308, LATCH_COUNT 310, OUT_0 312, OUT_1 314, OUT_2 316, OUT_3 318, OUT_4 320, OUT_5 322, OUT_6 324, and OUT_7 326. The time difference between REF 302 and FB_CLK 304 is shown as 4 ns at 330. The dashed arrow 332 indicates the phase to digital output at the rising edge of LATCH_COUNT 310. The input to the digital filter 14 at REF negative edge is shown at 334 along REF 302. The time difference between REF 302 and FB_CLK 304 is shown as 5 ns at 336. At 332, the phase to digital output is shown by OUT_7 to OUT 0, which is 01110110 or 118, while the PDC 12 output expected value is 4000/33.8875 or 118.04. The phase to digital output at 336 as shown by OUT_7 to OUT_0 is 10010011 or 147, while the PDC 12 expected value is 5000/33.8875 or 147.54. Thus, as can be seen, the PDC 12 is very accurate.

Embodiments of the invention have been described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by the applicable law. Moreover, any combination of the above-described elements in all possible variations thereof is encompassed by the invention unless otherwise indicated herein or otherwise clearly contradicted by context.

What is claimed is:

1. A phase locked loop for generating an oscillator signal, comprising:
   a phase to digital converter for receiving a reference clock and a feedback clock, and generating a digital output signal of a phase difference between the reference clock and the feedback clock, wherein the phase to digital converter operates on a first edge of the reference clock, and wherein the phase difference digital output signal includes a sign bit and a magnitude portion;
   a digital filter, connected to the phase to digital converter, for receiving the phase difference digital output signal and generating an oscillator control signal, wherein the digital filter operates on a second edge of the reference clock that is different from the first edge;
   a controlled oscillator, connected to the digital filter, for generating the oscillator signal, wherein a frequency of the oscillator signal is controlled using the oscillator control signal; and
   a loop divider, connected to the controlled oscillator, for receiving and dividing the oscillator signal to generate the feedback clock,
   wherein the phase to digital converter provides the phase difference digital output signal in a single clock period of the reference clock, and
   wherein the phase to digital converter comprises:
      a phase frequency detector (PFD) for determining the sign bit, wherein the PFD comprises:
         a shorter reset pulse circuit including:
            a first latch for generating an UP_SIGN signal,
            a second latch for generating a DOWN_SIGN signal,
            a third latch that receives the UP_SIGN signal and the DOWN_SIGN signal and generates the sign bit, and
            a first logic gate that receives the UP_SIGN signal and the DOWN_SIGN signal and generates a first latch reset signal that is provided to the reset inputs of the first and second latches; and a longer reset pulse circuit including:
            a fourth latch for generating an UP signal,
            a fifth latch for generating a DOWN signal,
            a second logic gate that receives the UP signal and the DOWN signal,
            a first plurality of series connected buffers, the first buffer of the series connected to an output of the second logic gate, and the last buffer of the series connected buffers generating a second latch reset signal that is provided to the reset inputs of the fourth and fifth latches,
            a first NOT gate having an input connected to the output of the second logic gate and generating a latch coarse counter signal, and
            a second NOT gate having an input connected to the output of the last buffer of the first plurality of series connected buffers and generating a latch count signal; and
      a time to digital converter (TDC) for generating the magnitude portion of the phase difference digital output signal.

2. The phase locked loop of claim 1, wherein the first edge of the reference clock is a rising edge and the second edge of the reference clock is a falling edge.

3. The phase locked loop of claim 1, wherein the PFD further comprises:
   an OR gate connected to the fourth and fifth latches for receiving the UP and DOWN signals and generating an UP_OR_DN signal;
   an AND gate connected to the fourth and fifth latches for receiving the UP and DN signals and generating an UP_AND_DN signal;
   wherein the UP_OR_DN and UP_AND_DN signals are used generate the phase difference digital output signal.

4. The phase locked loop of claim 3, wherein the phase to digital converter further comprises:
   a thermometric to binary converter for generating a plurality of low order bits of the phase difference digital output signal; and
   a coarse counter for generating a plurality of high order bits of the phase difference digital output signal.

5. The phase locked loop of claim 4, wherein the thermometric to binary converter and the coarse counter are reset by the UP_OR_DN signal.

6. The phase locked loop of claim 1, wherein the first and fourth latches have data input terminals connected to a first voltage signal and clock input terminals that receive the reference clock, and the second and fifth latches have data input terminals connected to the first voltage signal and clock input terminals that receive the feedback clock.

7. A phase to digital converter for receiving a reference clock and a feedback clock, and generating a digital output signal of a phase difference between the reference clock and the feedback clock, wherein the digital output signal includes a sign bit and a magnitude portion, the phase to digital converter comprising:
   a first reset pulse circuit that receives the reference clock and the feedback clock and generates the sign bit;
   a second reset pulse circuit that receives the reference clock and the feedback clock and generates phase difference information and a synchronization pulse signal;
   a thermometric to binary converter connected to the second reset pulse circuit for generating low order bits of the magnitude portion of the digital output signal; and
   a coarse counter connected to the second reset pulse circuit for generating high order bits of the magnitude portion of the digital output signal.

8. The phase to digital converter of claim 7, wherein the first reset pulse circuit comprises:
   a first latch, clocked by the reference clock, for generating an UP_SIGN signal;
   a second latch, clocked by the feedback clock, for generating a DOWN_SIGN signal;
   a third latch that receives the UP_SIGN signal and the DOWN_SIGN signal and generates the sign bit; and
   a first logic gate that receives the UP_SIGN signal and the DOWN_SIGN signal and generates a first latch reset signal that is provided to the reset inputs of the first and second latches.

9. The phase to digital converter of claim 8, wherein the second reset pulse circuit comprises:

a fourth latch, clocked by the reference clock, for generating an UP signal;

a fifth latch, clocked by the feedback clock, for generating a DOWN signal;

a second logic gate that receives the UP and DOWN signals;

a first plurality of series connected buffers, the first buffer of the series connected to an output of the second logic gate, and the last buffer of the series connected buffers generating a second latch reset signal that is provided to the reset inputs of the fourth and fifth latches;

a first NOT gate having an input connected to the output of the second logic gate and generating a latch coarse counter signal; and a second NOT gate having an input connected to the output of the last buffer of the first plurality of series connected buffers and generating a latch count signal.

10. The phase to digital converter of claim 9, wherein the thermometric to binary converter and the coarse counter are reset by the UP_OR_DN signal.

11. A phase to digital conversion method, comprising:
receiving a reference clock and a feedback clock;
determining a phase difference between the reference clock and the feedback clock;
determining a time difference between the reference clock and the feedback clock;
generating a digital signal corresponding to the time difference;
generating a synchronization clock using a reset pulse signal generated by a phase frequency detector;
using the synchronization clock to deliver a digital value of the phase error difference between the reference clock and the feedback clock in a single clock period of the reference clock; and
wherein the synchronization clock is generated using first and second phase frequency detectors, wherein the first phase frequency detector accommodates a shorter reset pulse width of the reset pulse signal than a reset pulse width of the reset pulse signal accommodated by the second phase frequency detector.

12. The method of claim 11, wherein determining the phase difference between the reference clock and the feedback clock is determined on the positive edge of the reference clock.

13. The method of claim 12, wherein the digital filter operates on the negative edge of the reference clock.

14. The method of claim 11, further comprising synchronizing the reset pulse signal with the reference clock and the feedback clock.

15. The method of claim 11, further comprising buffering the reset pulse signal of the second phase frequency detector so that the digital value of the phase error between the reference clock and the feedback clock is delivered within one period of the reference clock.

16. A phase locked loop for generating an oscillator signal, comprising:
a phase to digital converter for receiving a reference clock and a feedback clock, and generating a digital output signal of a phase difference between the reference clock and the feedback clock, wherein the phase difference digital output signal includes a sign bit and a magnitude portion, and wherein the phase to digital converter operates on a first edge of the reference clock;
a digital filter, connected to the phase to digital converter, for receiving the phase difference digital output signal and generating an oscillator control signal, wherein the digital filter operates on a second edge of the reference clock that is different from the first edge;
a controlled oscillator, connected to the digital filter, for generating the oscillator signal, wherein a frequency of the oscillator signal is controlled using the oscillator control signal; and
a loop divider, connected to the controlled oscillator, for receiving and dividing the oscillator signal to generate the feedback clock,
wherein the phase to digital converter provides the phase difference digital output signal in a single clock period of the reference clock, and
wherein the phase to digital converter comprises:
a dual phase frequency detector having a first phase frequency detector generating a first reset pulse having a first reset pulse width and a second phase frequency detector generating a second reset pulse having a second reset pulse width, wherein the first reset pulse width is shorter than the second reset pulse width, and wherein the first phase frequency detector generates the sign signal, and the second phase frequency detector generates a synchronization signal used to deliver the phase difference digital output signal to the digital filter.

* * * * *